United States Patent
Symanczyk et al.

(10) Patent No.: US 7,715,258 B2
(45) Date of Patent: May 11, 2010

(54) RETENTION TEST SYSTEM AND METHOD FOR RESISTIVELY SWITCHING MEMORY DEVICES

(75) Inventors: Ralf Symanczyk, München (DE);
Paul-Henri Albarede, Mennecy (FR);
Christelle Albarede, legal representative, Mennecy (FR)

(73) Assignees: Qimonda AG, Munich (DE); Altis Semiconductor, Corbeil Essonnes Cedex (FR)

( * ) Notice: Subject to any disclaimer, the term of this patent is extended or adjusted under 35 U.S.C. 154(b) by 0 days.

(21) Appl. No.: 11/962,956

(22) Filed: Dec. 21, 2007

(65) Prior Publication Data

US 2009/0161460 A1    Jun. 25, 2009

(51) Int. Cl.
*G11C 29/00* (2006.01)

(52) U.S. Cl. ............. 365/201; 365/185.09; 365/185.18; 365/185.22; 365/189.07

(58) Field of Classification Search ............... 365/201, 365/185.09, 185.18, 185.22, 189.07
See application file for complete search history.

(56) References Cited

U.S. PATENT DOCUMENTS

| | | | | |
|---|---|---|---|---|
| 5,359,205 | A * | 10/1994 | Ovshinsky | 257/3 |
| 5,523,964 | A * | 6/1996 | McMillan et al. | 365/145 |
| 6,826,078 | B2 * | 11/2004 | Nishiyama et al. | 365/158 |
| 7,072,781 | B1 * | 7/2006 | Gershon et al. | 702/63 |
| 2006/0198183 | A1 * | 9/2006 | Kawahara et al. | 365/163 |
| 2007/0007513 | A1 * | 1/2007 | Conoci et al. | 257/40 |
| 2009/0034343 | A1 * | 2/2009 | Nirschl et al. | 365/189.07 |
| 2009/0039337 | A1 * | 2/2009 | Ohba et al. | 257/4 |

* cited by examiner

*Primary Examiner*—Viet Q Nguyen
(74) *Attorney, Agent, or Firm*—Dicke, Billig & Czaja, PLLC

(57) ABSTRACT

A retention test system and method for resistively switching memory devices is disclosed. One embodiment provides a plurality of memory cells configured to be changed over between a first state of high electrical resistance and a second state of low electrical resistance, wherein the system is configured to apply a bias voltage to at least one memory cell of the memory device to be tested.

25 Claims, 5 Drawing Sheets

RETENTION TEST SYSTEM AND METHOD FOR RESISTIVELY SWITCHING MEMORY DEVICES

BACKGROUND

The present invention relates to a resistive switching memory device, and to a retention test for resistively switching memory devices.

Resistively switching memory devices include resistive memory cells for storing information. The memory cells can be changed between a first state of electrical resistance and a second state of electrical resistance. One type of resistively switching memory devices is a CBRAM device based on conductive bridge junction (CBJ) memory cells.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Before individual exemplary embodiments of system and methods for testing conductive bridging memory devices according to one or more embodiments are described below, the fundamental structure of a CBJ (CBJ=Conductive Bridging Junction) memory cell, the latter's switching mechanism, circuit types and reaction to applied voltage pulses are respectively described by way of example with reference to accompanying FIGS. 1A and 1B. CBRAM technology will be discussed here by way of example for resistive memory technologies.

Figure 1A:
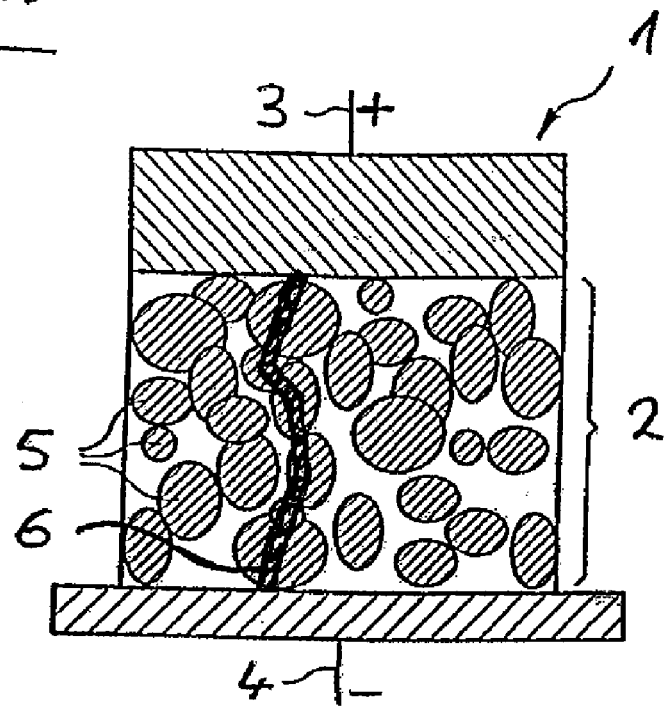
FIG. 1A illustrates a schematic cross section of a CBRAM memory cell in a low-resistance state (ON state).
Figure 1B:
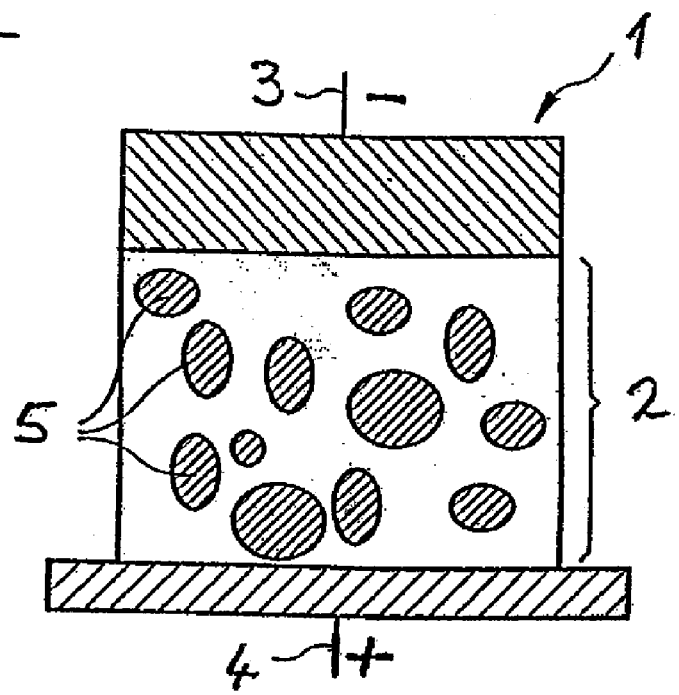
FIG. 1B illustrates a schematic cross section of a CBRAM memory cell in a high-resistance state (OFF state).

In FIGS. 1A and 1B the construction of a CBJ memory cell is illustrated in schematic cross section, respectively. FIG. 1A illustrates the schematic structure of a CBRAM memory cell 1 in an electrically high conductive, i.e. low-resistance state (On state). The CBRAM memory cell 1 includes a layer 2 of a solid electrolyte material with resistively switching properties, e.g., a chalcogenide material that may be manufactured of GeSe, GeS, SiSe, SiS, and/or AgSe or Ag—S. Furthermore, the chalcogenide material includes a metallic material with soluble ions of high mobility within the chalcogenide material, such as Ag, Cu or Zn ions that were diffused or doped into the chalcogenide material. Consequently, the chalcogenide material layer 2 has the property of forming so called conductive bridges or paths 6.

The CBRAM memory cell 1 further includes two electrodes 3 and 4 that are added to the chalcogenide layer 2 and are in electric contact therewith. The chalcogenide material layer 2 is in direct contact with both electrodes 3 and 4, while the two electrodes 3 and 4 neither have a direct electric contact nor an interface with each other, so that the chalcogenide material layer 2 separates the two electrodes 3, 4 from one another. Electric current or voltage pulses may be applied to the chalcogenide material layer 2 via the electrodes 3 and 4. Furthermore, the electrodes 3, 4 are each connected with metal lines or metal connections (not illustrated) so as to electrically connect the CBRAM memory cell 1 with other devices, e.g., transistors or other CBRAM memory cells.

The first electrode 3 which is also in direct contact with the chalcogenide material 2, may be manufactured of a movable active material, e.g., of Cu, Ag or Zn, so as to serve as an ion donor for the chalcogenide material layer 2. The second electrode 4 may be manufactured of a semiconductive or metallic material that neither has significant solubility nor significant mobility in the chalcogenide material, so that the material of the second electrode 4 does not penetrate the chalcogenide material layer 2 significantly and does not intermix therewith. Therefore, the second electrode 4 is manufactured of an inert material such as W, Ti, Ta, TiN, Pt, or doped Si, TaN, AL, for example.

The atoms of the metallic material in the chalcogenide material may form metal-rich deposits or conglomerates 5. These metal-rich deposits 5 are cluster-like, amorphous or nanocrystalline aggregations that form enhanced metallic regions in the chalcogenide material. The resistive memory switching mechanism of the CBRAM memory cell 1 is substantially based on a variation of the concentration of the metallic material that is incorporated in the chalcogenide material layer 2.

The chalcogenide material layer 2, a variable amount of metallic atoms, and cluster-like amorphous or nanocrystalline aggregations 5 form the resistance switching behavior basis of the CBRAM memory cell 1. The variation of the total amount of the deposits 5 present in the chalcogenide material layer 2 causes a quick modification of the physical, in one embodiment the electric properties of the CBRAM memory cell 1. The resistive switching mechanism is based on the statistical formation of conductive bridges or paths 6 made of multiple metal-rich deposits 5 within the chalcogenide material layer 2.

For programming the memory cell 1, the top electrode 3 may be charged with a positive voltage, and the bottom electrode 4, for instance, with a programming voltage of opposite polarity. In the illustrated example, the top electrode 3 is charged with a positive voltage and the bottom electrode 4 with a negative voltage. Thus, mobile metal ions can penetrate the chalcogenide material layer 2 from the top electrode 3 and electrons from the bottom electrode 4.

Due to the continued application of an electric writing pulse by means of the programming voltage to the CBRAM memory cell 1, these deposits 5 continue to grow in size and/or density, some of which eventually make contact with each other. Thereby, conductive bridges or paths 6 may be generated through the entire chalcogenide material 2, which results in a higher electric conductivity through a metallic connection between the two electrodes 3 and 4 of the memory cell 1. This process programs the memory cell 1 by producing high conductivity between the electrodes 3 and 4, thus constituting the highly conductive or low-resistance state (ON-state). This state may be maintained for a lengthy storage time, so that the non-volatility of the programming is ensured.

FIG. 1B illustrates a schematic CBRAM memory cell in a low conductive or high-resistance state (OFF state). The above-described programming of the memory cell 1 in a highly conductive or low-resistance state is reversible. To this end, voltage, i.e. deleting voltages, that are opposite inverse to the voltage for the programming process described in FIG. 1A are applied to the electrodes 3, 4 of the memory cell 1, wherein, in the illustrated example, the top electrode 3 is charged with a negative voltage and the bottom electrode 4 with a positive voltage. Thus, the mobile metal ions are drawn out from the chalcogenide material layer 2 via the negatively charged top electrode 3 and the electrons are drawn out from the chalcogenide material layer 2 via the positively charged bottom electrode 4.

The drawing out of the mobile metal ions from the chalcogenide material layer 2 causes a reduction of number and/or size of the metal-rich deposits 5 in the chalcogenide material. The electric bridging of the chalcogenide material layer 2 is reduced as the distances between the deposits 5 are enlarged. This way, the isolated deposits 5 are no longer in contact with each other and no longer form an electrically conductive bridge 6 through the previously highly conductive, i.e. low-resistance chalcogenide material layer 2. This process results in a deletion of the memory cell 1 and produces a situation with low conductivity between the electrodes 3 and 4, which constitutes the low conductive, i.e. high-resistance state (OFF state) of the memory cell 1.

In the description below of FIGS. 2 to 4, the following abbreviations are used and indicated as reference signs in the drawings:

BL=Bitline
WL=Wordline
PL=Plate
MBL=Master Bit Line
MWL=Master Word Line
CBJ=Conductive Bridging Junction or memory cell.

Figure 2:
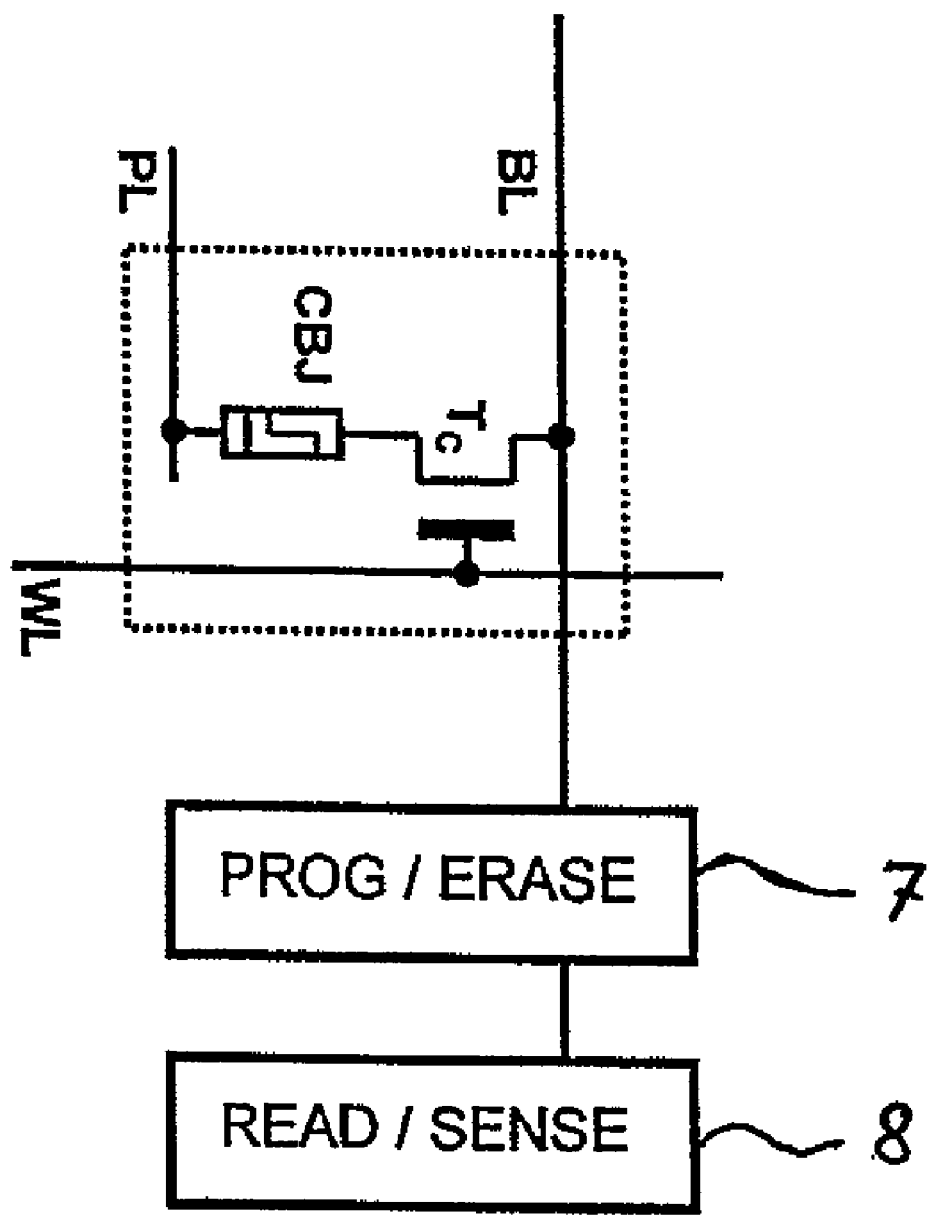
FIG. 2 illustrates a schematic circuit for addressing a memory cell of a CBRAM device.

FIG. 2 illustrates a schematic circuit for addressing a memory cell of a CBRAM device. As described above an integrated CBRAM memory arrangement is based on CBJ (CBJ=Conductive Bridging Junction) memory cells that can be changed between a first state of high electrical resistance and a second state of low electrical resistance. For this purpose, a plurality of conductive bridging memory cells CBJ can be arranged in an array provided by wordlines WL, bitlines BL and a plate PL. In FIG. 2 a dotted square indicates one memory cell CBJ in connection with a transistor Tc which acts as select- and control-device of the memory cell CBJ.

Each memory cell CBJ may be connected to a respective bitline BL via a transistor Tc and to the plate PL or vice versa, whereas the gate of the transistor Tc is connected to the respective wordline WL. The anode of the memory cell CBJ may connected to the plate PL or to the transistor Tc. Thus, the transistor Tc may act as select-and-control-device of the memory cell. Different control signals can be provided to the memory cell CBJ via the wordline WL. A program/erase signal can be provided by a program/erase generator 7 to program data into the memory cell CBJ or to erase data from the memory cell CBJ in the above described manner, and a read/sense signal can be provided by a read/sense generator 8 to read out/sense data from the memory cell CBJ.

Figure 3:
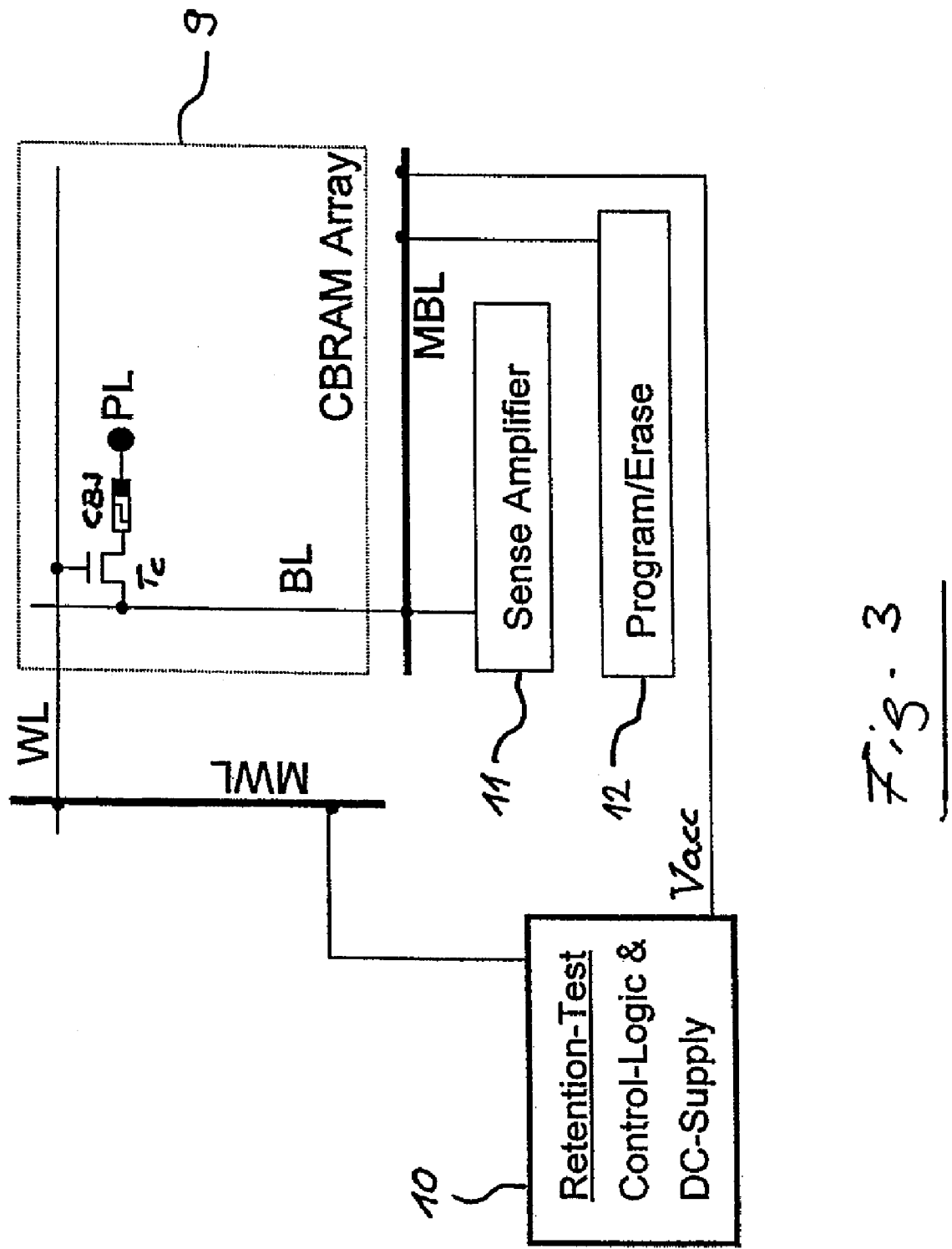
FIG. 3 illustrates a schematic circuit for testing a CBRAM device according to another embodiment.
Figure 4:
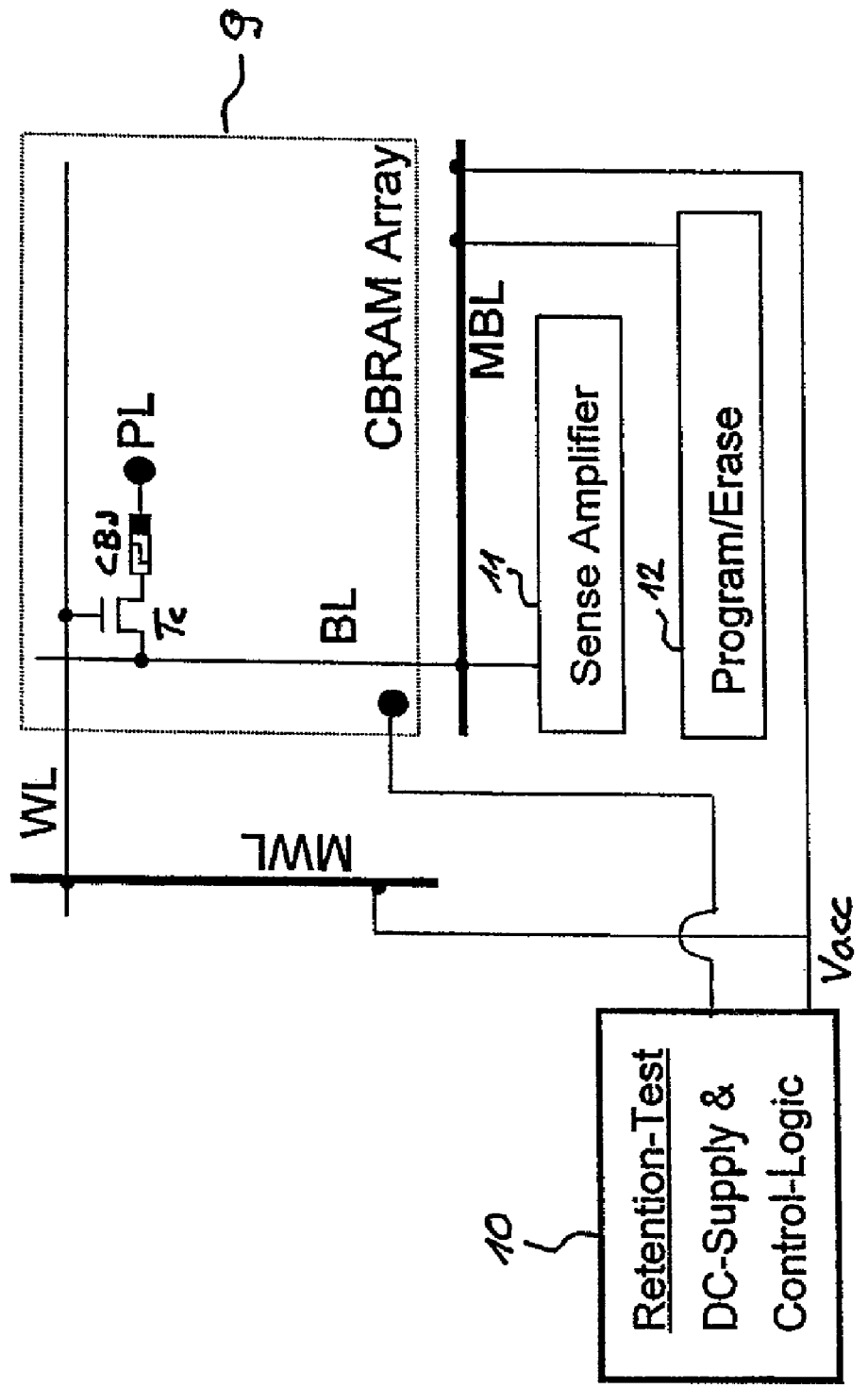
FIG. 4 illustrates a schematic circuit for testing a CBRAM device according to one embodiment.

FIGS. 3 to 4 illustrate different schematic circuits configured for testing a CBRAM device according to an embodiment of the present invention. In both embodiments a memory cell CBJ is arranged in an array 9 provided by wordlines WL, bitlines BL and a plate PL. The array 9 may include a plurality of memory cells CBJ and may be implemented in a CBRAM device. Each memory cell CBJ may be connected to a respective bitline BL via a transistor Tc and to the plate PL, whereas the gate of the transistor Tc is connected to the respective wordline WL. The anode of the memory cell CBJ may be connected to the plate PL or to the transistor Tc depending on bias conditions used. Thus, the transistor Tc can act as select-and-control-device of the memory cell CBJ. The array 9 provided by wordlines WL, bitlines BL and a plate PL, including a plurality of memory cells CBJ with transistors Tc, may be integrated in a resistively switching memory devices, such as a CBRAM device.

FIG. 3 illustrates a schematic circuit usable for testing a CBRAM device according to an embodiment of the present invention. In this embodiment a Master Word Line MWL and a Master Bit Line MBL are integrated in the CBRAM device to address the array 9 of memory cells CBJ. Thus, single Bitlines BL can be activated separately or in parallel.

Further, a control logic may be provided for controlling retention tests performed on the CBRAM device. A retention test can be done by activating the respective Master Bit Line MBL and the respective Master Word Line MWL. Thus, single memory cells CBJ of the array 9 of memory cells can be activated. Furthermore, a DC voltage supply may be provided for supplying a DC bias voltage Vacc to the memory cells CBJ of the CBRAM device under the retention test.

The control logic and DC voltage supply may be combined in a common module 10 as indicated in FIG. 3. Both the control logic and DC voltage supply may be arranged inside or outside of the CBRAM device. In one embodiment, the control logic may be arranged inside or on chip of the CBRAM device, and the DC voltage supply may be arranged inside or on chip of the CBRAM device. The CBRAM device to be tested may include additional pads for coupling with an external control logic and/or with an external DC voltage supply.

The DC bias voltage Vacc may be provided to the memory cells CBJ via the respective Master Bit Line MBL to accelerate the retention test time. In this case, the bias voltage applied to the memory cell CBJ under retention test may be calculated according to the following equation:

$$V(CBJ) = V(\text{plate}) - Vacc - V(Tc)$$

where V(CBJ) is the voltage applied to the memory cell under retention test, V(plate) is the plate voltage, Vacc is the DC bias voltage applied to the respective Master Bit Line MBL for the memory cell to be tested, and V(Tc) is the voltage drop at the transistor Tc. However, the voltage drop V(Tc) of the transistor Tc may be ignored for the calculation as it is insignificant with respect to the DC bias voltage Vacc.

Different control signals can be provided to the memory cell CBJ via the Master Bit Line MBL. For example, a program/erase signal can be provided by a program/erase generator 12 to program data into the memory cell CBJ or to erase the memory cell CBJ, and a sense amplifier 11 may be provided to read out/sense data content from the memory cell CBJ via the respective bitline BL.

FIG. 4 illustrates a schematic circuit configured for testing a CBRAM device according to another embodiment of the present invention. The embodiment illustrated in FIG. 4 corresponds to the embodiment illustrated in FIG. 3 except for an additional connection between the control logic in the common module 10 and the Plate PL of the CBRAM device via pass-through holes or vias indicated by circular connection dots in FIG. 4 within the array 9 of memory cells. As the plate PL is situated in a layer underneath the image plane of FIG. 4, the pass-through holes or vias represented by the circular connection dots indicate a connection between the control logic and the Plate PL. Furthermore, in the embodiment illustrated in FIG. 3 the DC voltage supply may apply a DC bias voltage Vacc only to the Master Bit Line MBL, whereas in the embodiment illustrated in FIG. 4 the DC voltage supply may apply a DC bias voltage Vacc to both the Master Bit Line MBL and the Master Word Line MWL.

In the embodiment illustrated in FIG. 4, the Master Word Line MWL and the Master Bit Line MBL are integrated in the CBRAM device to address the array 9 of memory cells CBJ. Thus, single Bitlines can be activated separately or in parallel. Further, a control logic may be provided for controlling retention tests performed on the CBRAM device. A retention test can be done by activating the respective Master Bit Line MBL and the respective Master Word Line MWL. Thus, single memory cells CBJ of the array 9 of memory cells can be activated. Furthermore, a DC voltage supply may be provided for supplying a DC bias voltage Vacc to the memory cells CBJ of the CBRAM device under test. The control logic and DC voltage supply may be combined in a common module 10 as indicated in FIG. 4.

According to the embodiment illustrated in FIG. 4, the DC bias voltage Vacc may be provided to the memory cells CBJ via the Plate PL of the CBRAM device for accelerating the retention test time. In this case, the voltage applied to the memory cell CBJ under retention test may be calculated according to the following equation:

$$V(CBJ) = Vacc - V(MBL) - V(Tc)$$

where V(CBJ) is the voltage applied to the memory cell under retention test, V(MBL) is the voltage of the respective Master Bit Line MBL, Vacc is the DC bias voltage applied to the Plate PL for the memory cell to be tested, and V(Tc) is the voltage drop at the transistor Tc. However, the voltage drop V(Tc) of the transistor Tc may be ignored for the calculation as it is insignificant with respect to the DC bias voltage Vacc.

Different control signals can be provided to the memory cell CBJ via the Master Bit Line MBL. For example, a program/erase signal can be provided by a program/erase generator 12 to program data into the memory cell CBJ or to erase the memory cell CBJ, and a sense amplifier 11 may be provided to read out/sense data content from the memory cell CBJ via the respective bitline BL.

Figure 5B:
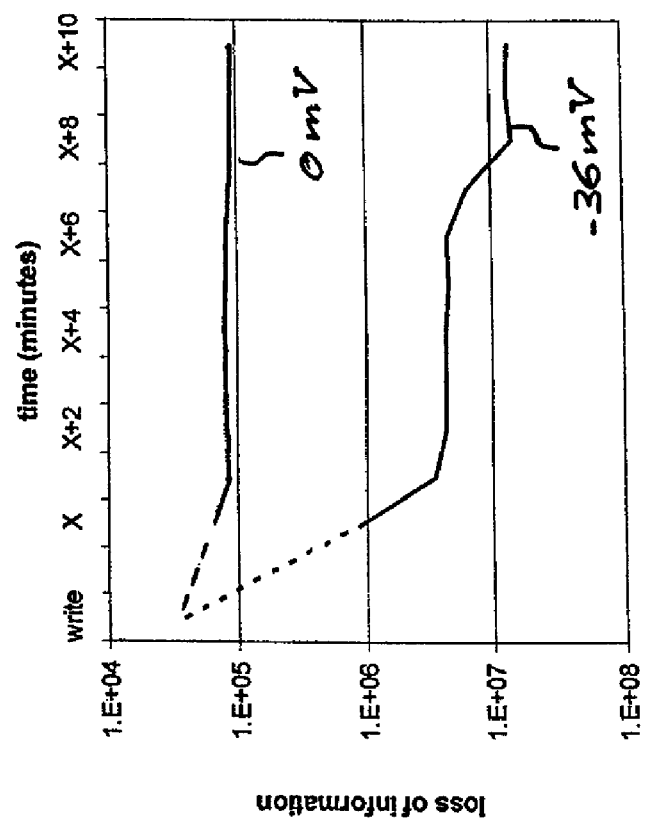
FIGS. 5A and 5B illustrate schematic diagrams indicating the principle behavior of data retention in a CBRAM device under retention test.
Figure 5A:
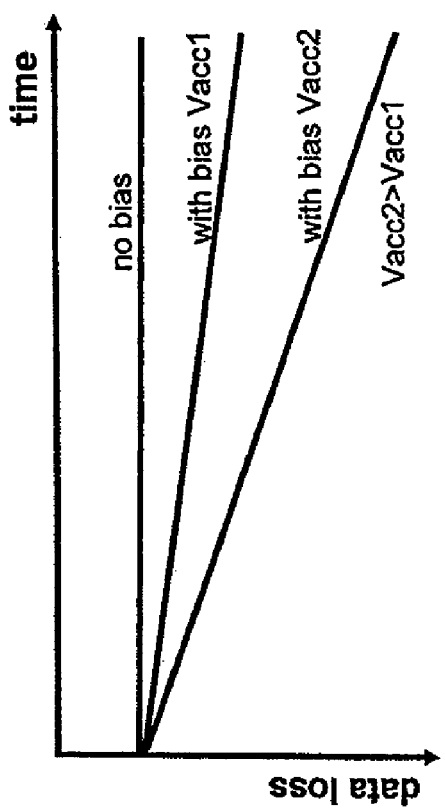

FIG. 5A illustrates a schematic diagram indicating the principle behavior of data retention in a CBRAM device under test. As illustrated, the time for the loss of data in a CBRAM memory cell under test is illustrated dependent on the bias voltage applied to the CBRAM memory cell. The diagram of FIG. 5A illustrates three different lines. The upper line indicates the time chart for the loss of information (duration time) of a CBRAM memory cell with no bias voltage, the middle line indicates the loss of information in a CBRAM memory cell with a bias voltage Vacc1, and the lower line indicates the loss of information in a CBRAM memory cell with a bias voltage of Vacc2, where Vacc2>Vacc1.

It can be seen from a comparison of the lines in FIG. 5A that the loss of data in a CBRAM memory cell is dependent on the bias voltage Vacc applied to the memory cell under test. The higher the bias voltage Vacc applied to the memory cell, the more accelerated the loss of data in the memory cell.

FIG. 5B illustrates a schematic diagram of experimental results obtained during a data retention test of a CBRAM device. The diagram of FIG. 5B illustrates two different lines starting from point of time writing data into a CBRAM memory cell. The upper line indicates the time for the loss of information (or the duration time) of a CBRAM memory cell without a bias voltage (Vacc=0 mV) and the lower line indicates the time for the loss of information (or the duration time) of a CBRAM memory cell exposed to a bias voltage of Vacc=−36 mV.

It can be seen from FIG. 5B that the time for a loss of data in a CBRAM memory cell is clearly dependent on the bias voltage Vacc applied to the memory cell under test. The higher the bias voltage applied to the memory cell, the more accelerated the loss of data in the memory cell. Thus, the duration time of the CBRAM memory cell can be reduced by applying a respective bias voltage to the CBRAM memory cell under test. As a result, duration of data retention tests of CBRAM devices may be performed in shorter time periods which reduces test time and costs.

The present invention may be embodied in a system with means for performing a retention test on resistively switching memory devices with a plurality of memory cells configured to be changed between a first state of high electrical resistance and a second state of low electrical resistance, the system further including means to apply a bias voltage to at least one memory cell of the memory device under retention test.

Furthermore, the present invention may be embodied in a memory device, an integrated circuit or in an electronic-readable medium including one or more of the above discussed features. Although the present invention was described in connection with nonvolatile CBRAM devices, it can also be applied to other types of memory devices, e.g., to Flash, PCRAM devices or volatile memories.

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

As different embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system comprising:
   a test system configured to perform a retention test on resistively switching memory devices with a plurality of memory cells, the memory cells configured to be changed between a first state of high electrical resistance and a second state of low electrical resistance, wherein the system is configured to apply a bias voltage to at least one memory cell of the memory device to be tested, and
   wherein an anode of the at least one memory cell is connected to a plate of the memory device or to a transistor in dependence of bias conditions used, and wherein the system is configured to provide the bias voltage to the memory cells via the plate of the memory device.

2. The system of claim 1, wherein the system is configured to apply the bias voltage to the at least one memory cell of the memory device during the retention test.

3. The system of claim 1, wherein the system is configured to apply the bias voltage to the at least one memory cell of the memory device before the retention test.

4. The system of claim 1, wherein the system is configured to provide the bias voltage to the memory cells in accordance with the equation:

$$V(CBJ) = Vacc - V(MBL) - V(Tc),$$

where V(CBJ) is a voltage applied, to the memory cell to be tested, V(MBL) is a voltage of a respective master bit line, Vacc is a bias voltage applied to the plate of the memory cell to be tested, and V(Tc) is a voltage drop at a select transistor of the memory cell.

5. The system of claim 1, wherein the plurality of memory cells are arranged in a number of arrays with wordlines and bitlines, and a master bit line is integrated in the memory device, the master bit line being configured to address at least one array of memory cells and to activate single bitlines in parallel.

6. A system comprising:
   a test system configured to perform a retention test on resistively switching memory devices with a plurality of memory cells, the memory cells configured to be changed between a first state of high electrical resistance and a second state of low electrical resistance, wherein the system is configured to apply a bias voltage to at least one memory cell of the memory device to be tested,
   wherein the plurality of memory cells are arranged in a number of arrays with wordlines and bitlines, and a master word line and a master bit line is integrated in the memory device, the master word line and master bit line being configured to address at least one array of memory cells and to activate single wordlines and/or single bitlines separately or in parallel, and wherein the test system is configured to provide the bias voltage to the memory cells via the respective master bit line and/or via the respective master word line, and
   wherein the system is configured to provide the bias voltage to the memory cells in accordance with the equation:

$$V(CBJ) = V(plate) - Vacc - V(Tc),$$

where V(CBJ) is a voltage applied to the memory cell to be tested, V(plate) is a plate voltage, Vacc is the bias voltage applied to the respective master bit line for the memory cell to be tested, and V(Tc) is a voltage drop at a select transistor of the memory cell.

7. The system of claim 6, wherein the system is configured to perform the retention test under activation of the respective master bit line and of the respective master word line to activate single memory cells or arrays of memory cells of the memory device.

8. The system of claim 1, wherein the system is configured to set a number of memory cells into a defined state before applying a bias voltage to the number of memory cells.

9. The system of claim 1, further comprising a DC voltage supply for supplying the bias voltage to the at least one memory cell of the memory device.

10. The system of claim 9, wherein the DC voltage supply is configured to supply different bias voltages to memory cells of the memory device.

11. The system of claim 9, further comprising a control logic configured to control the retention test performed on the memory device.

12. The system of claim 11, wherein the control logic and DC voltage supply are combined in a common module.

13. The system of claim 11, wherein the control logic and the DC voltage supply are arranged outside, inside and/or on chip of the memory device.

14. The system of claim 11, wherein the system is configured to provide different control signals to the memory cell via the respective master bit line.

15. A method comprising:
   performing a retention test on resistively switching memory devices with a plurality of memory cells configured to be changed between a first state of high electrical resistance and a second state of low electrical resistance; and
   applying a bias voltage to at least one memory cell of the memory device to be tested during the method,
   wherein, when the plurality of memory cells are arranged in a number of arrays with wordlines and bitlines, and a master word Line and a master bit line is integrated in the memory device, addressing at least one array of memory cells via the master word Line and/or via the master bit line thereby activating single wordlines and/or single bitlines separately or in parallel, and
   wherein applying the bias voltage comprises providing the bias voltage to the memory cell via the respective master bit line and/or master word Line and/or via a plate of the memory device.

16. The method of claim 15, comprising applying the bias voltage to the at least one memory cell of the memory device before and/or during test signals are applied to the at least one memory cell of the memory device.

17. The method of claim 15, comprising performing the retention test by activation of the respective master bit line and of the respective master word Line to activate single memory cells or arrays of memory cells of the memory device.

18. The method of claim 15, wherein a DC voltage supply provides different bias voltages to memory cells of the memory device.

19. The method of claim 15, comprising applying the bias voltage to the memory cell in accordance with the equation:

$$V(CBJ) = V(plate) - Vacc - V(Tc),$$

whereas V(CBJ) is a bias voltage applied to the memory cell, V(plate) is a plate voltage of the memory device, and Vacc is a bias voltage applied to the respective master bit line addressing the memory cell to be tested, and V(Tc) is a voltage drop at a select transistor of the memory cell.

20. The method of claim 15, comprising applying the bias voltage to the memory cell in accordance with the equation:

$$V(CBJ) = Vacc - V(MBL) - V(Tc),$$

whereas V(CBJ) is a bias voltage applied to the memory cell, V(MBL) is a voltage of the respective master bit line, and Vacc is a bias voltage applied to the plate for the memory cell to be tested, and V(Tc) is a voltage drop at a select transistor of the memory cell.

21. An integrated circuit comprising:
a test circuit configured to perform a retention test on resistively switching memory devices with a plurality of memory cells configured to be changed between a first state of high electrical resistance and a second state of low electrical resistance, wherein the circuit is configured to apply a bias voltage to at least one memory cell of the memory device to be tested,
wherein an anode of the at least one memory cell is connected to a plate of the memory device or to a transistor in dependence of bias conditions used,
wherein the plurality of memory cells are arranged in a number of arrays with wordlines and bitlines, and a master word line and a master bit line is integrated in the memory device, the master word line and master bit line being configured to address at least one array of memory cells and to activate single wordlines and/or single bitlines separately or in parallel, and
wherein the circuit is configured to apply the bias to the at least one memory cell via the respective master bit line and/or master word line and/or via the plate of the memory device.

22. The integrated circuit of claim 21, wherein the test circuit is configured to provide the bias voltage to the memory cells in accordance with the equation:

$$V(CBJ) = Vacc - V(MBL) - V(Tc),$$

where V(CBJ) is a voltage applied to the memory cell to be tested, V(MBL) is a voltage of the respective master bit line, Vacc is a bias voltage applied to the plate of the memory cell to be tested, and V(Tc) is a voltage drop at a select transistor of the memory cell.

23. The integrated circuit of claim 21, wherein the test circuit is configured to provide the bias voltage to the memory cells in accordance with the equation:

$$V(CBJ) = V(\text{plate}) - Vacc - V(Tc),$$

where V(CBJ) is a voltage applied to the memory cell to be tested, V(plate) is a plate voltage, Vacc is the bias voltage applied to the respective master bit line for the memory cell to be tested, and V(Tc) is a voltage drop at a select transistor of the memory cell.

24. The integrated circuit of claim 21, wherein the test circuit is configured to apply the bias voltage to the at least one memory cell of the memory device during the retention test.

25. The integrated circuit of claim 21, wherein the test circuit is configured to apply the bias voltage to the at least one memory cell of the memory device before the retention test.

* * * * *